United States Patent
Onoue

(10) Patent No.: US 9,720,317 B2
(45) Date of Patent: Aug. 1, 2017

(54) SUBSTRATE WITH A MULTILAYER REFLECTIVE FILM, REFLECTIVE MASK BLANK FOR EUV LITHOGRAPHY, REFLECTIVE MASK FOR EUV LITHOGRAPHY AND METHOD OF MANUFACTURING THE SAME, AND METHOD OF MANUFACTURING A SEMICONDUCTOR DEVICE

(71) Applicant: HOYA CORPORATION, Tokyo (JP)

(72) Inventor: Takahiro Onoue, Tokyo (JP)

(73) Assignee: HOYA CORPORATION, Tokyo (JP)

(*) Notice: Subject to any disclaimer, the term of this patent is extended or adjusted under 35 U.S.C. 154(b) by 13 days.

(21) Appl. No.: 14/908,955

(22) PCT Filed: Sep. 9, 2014

(86) PCT No.: PCT/JP2014/073727
§ 371 (c)(1),
(2) Date: Jan. 29, 2016

(87) PCT Pub. No.: WO2015/037564
PCT Pub. Date: Mar. 19, 2015

(65) Prior Publication Data
US 2016/0202601 A1    Jul. 14, 2016

(30) Foreign Application Priority Data
Sep. 11, 2013  (JP) .................. 2013-188329

(51) Int. Cl.
G03F 1/24       (2012.01)
G03F 1/48       (2012.01)
G03F 7/20       (2006.01)

(52) U.S. Cl.
CPC ............... *G03F 1/24* (2013.01); *G03F 1/48* (2013.01); *G03F 7/2004* (2013.01)

(58) Field of Classification Search
None
See application file for complete search history.

(56) References Cited

U.S. PATENT DOCUMENTS

2002/0045108 A1   4/2002  Lee et al.
2012/0145534 A1   6/2012  Kageyama
(Continued)

FOREIGN PATENT DOCUMENTS

JP    2002-122981 A   4/2002
JP    2005-268750 A   9/2005
(Continued)

OTHER PUBLICATIONS

International Search Report of PCT/JP2014/073727 dated Nov. 25, 2014.

*Primary Examiner* — Stephen Rosasco
(74) *Attorney, Agent, or Firm* — Sughrue Mion, PLLC

(57) ABSTRACT

A substrate with a multilayer reflective film that yields a reflective mask achieving high reflectance and exhibiting excellent cleaning resistance. The present invention is directed to a substrate with a multilayer reflective film, which has: a substrate; a multilayer reflective film, formed on a substrate, having a layer comprising Si as a high refractive-index material and a layer comprising a low refractive-index material, wherein the layers are periodically laminate; and a Ru protective film, formed on the multilayer reflective film, for protecting the multilayer reflective film, wherein the surface layer of the multilayer reflective film on the other side of the substrate is the layer comprising Si, and wherein the Ru protective film comprises a Ru compound comprising Ru and Ti, wherein the Ru compound contains Ru in an amount greater than that in the stoichiometric composition of RuTi.

12 Claims, 4 Drawing Sheets

(56) References Cited

U.S. PATENT DOCUMENTS

| | | |
|---|---|---|
| 2012/0196208 A1 | 8/2012 | Mikami et al. |
| 2012/0219890 A1 | 8/2012 | Mikami |
| 2012/0225375 A1 | 9/2012 | Mikami |
| 2012/0231378 A1 | 9/2012 | Mikami et al. |
| 2013/0115547 A1 | 5/2013 | Mikami et al. |

FOREIGN PATENT DOCUMENTS

| | | |
|---|---|---|
| JP | 2007-273656 A | 10/2007 |
| JP | 2008-016821 A | 1/2008 |
| JP | 2012-129520 A | 7/2012 |
| TW | 201243487 A | 11/2012 |
| WO | 2011/068223 A1 | 6/2011 |
| WO | 2011/071086 A1 | 6/2011 |
| WO | 2011/071126 A1 | 6/2011 |
| WO | 2012/014904 A1 | 2/2012 |
| WO | 2012/102313 A1 | 8/2012 |

SUBSTRATE WITH A MULTILAYER REFLECTIVE FILM, REFLECTIVE MASK BLANK FOR EUV LITHOGRAPHY, REFLECTIVE MASK FOR EUV LITHOGRAPHY AND METHOD OF MANUFACTURING THE SAME, AND METHOD OF MANUFACTURING A SEMICONDUCTOR DEVICE

CROSS REFERENCE TO RELATED APPLICATIONS

This application is a National Stage of International Application No. PCT/JP2014/073727, filed Sep. 9, 2014, claiming priority based on Japanese Patent Application No. 2013-188329, filed Sep. 11, 2013, the contents of all of which are incorporated herein by reference in their entirety.

FIELD OF THE INVENTION

The present invention relates to a substrate with a multilayer reflective film, which is an original form for manufacturing a mask for exposure, used in, for example, manufacturing a semiconductor device, a reflective mask blank for EUV lithography, a reflective mask for EUV lithography and a method of manufacturing the same, as well as a method of manufacturing a semiconductor device.

BACKGROUND ART

As demands for VLSI devices having an increased density and improved precision are further increasing in recent years, EUV lithography, which is an exposure technique using an extreme ultraviolet light (hereinafter, referred to as "EUV"), is considered promising. The EUV light indicates light in a wavelength range of a soft X-ray region or a vacuum ultraviolet region, specifically, light having a wavelength of about 0.2 to 100 nm.

A reflective mask used in such lithography has formed on, e.g., a glass or silicon substrate a multilayer reflective film for reflecting an exposure light, wherein the multilayer reflective film has formed therein a pattern of an absorber film for absorbing an exposure light. In an exposure machine for performing pattern transfer, light striking the reflective mask mounted on the exposure machine is absorbed by portions of the multilayer reflective film having the absorber film pattern and reflected by portions of the multilayer reflective film having no absorber film pattern. Then, the reflected light image is transferred through a reflection optical system onto a semiconductor substrate, such as a silicon wafer.

For achieving a semiconductor device having an increased density and improved precision using the above reflective mask, the reflective region in the reflective mask (the surface of the multilayer reflective film) is required to have a high reflectance with respect to an EUV light, which is an exposure light.

To achieve the above-described high reflectance, the multilayer reflective film is a multilayer film comprising elements having different refractive indices, which are periodically laminated, and, generally, a multilayer film is used in which a thin film of a heavy element, or a compound thereof, and a thin film of a light element, or a compound thereof, are alternately laminated in about 40 to 60 cycles of the layers. For example, as a multilayer reflective film for an EUV light having a wavelength of 13 to 14 nm, a Mo/Si periodically laminated film, in which a Mo film and a Si film are alternately laminated in about 40 cycles of the layers, is preferably used. Mo is easily oxidized in air which decrease the reflectance of the multilayer reflective film, and therefore the Si film constitutes the uppermost layer of the multilayer reflective film.

As a reflective mask used in the EUV lithography, for example, there is a reflective mask for exposure described in Patent Document 1 below. Specifically, Patent Document 1 has proposed a reflective photomask characterized by having: a substrate; a reflective layer, formed on the substrate, comprising a multilayer film in which two different films are alternately laminated; a buffer layer, formed on the reflective layer, comprising a ruthenium film; and an absorber pattern, formed on the buffer layer so as to have a predetermined pattern form, comprising a material capable of absorbing a soft X-ray.

The above-described buffer layer is also called a protective film. When forming the absorber pattern, a part of the absorber film is etched through a resist, and, to ensure the formation of the absorber pattern, the absorber film is subjected to over etching slightly, and therefore the film present under the absorber film is inevitably etched. In this instance, to prevent the multilayer reflective film under the absorber film from suffering a damage, a protective film is formed.

With respect to the protective film, further, from the viewpoint of suppressing the formation of a diffused layer (which leads to a reduction of the reflectance of the multilayer reflective film) between the Si layer constituting the surface layer of the multilayer reflective film and the protective film, a protective film comprising a Ru alloy having Zr or B added to Ru has been proposed (Patent Document 2).

Further, Patent Document 3 has proposed a method of manufacturing an EUV mask blank, which can reduce foreign matter caused due to a sputtering target, in which a Mo film and a Si film are alternately deposited on a substrate to form a multilayer reflective film, and a Ru film or a Ru compound film is deposited on the multilayer reflective film, wherein the deposition of these films is conducted by an ion beam sputtering method in the same deposition chamber under predetermined conditions. In this document, examples of the above-described Ru compounds, include RuB, RuNb, and RuZr.

PRIOR ART REFERENCES

Patent Documents

Patent Document 1: JP 2002-122981A
Patent Document 2: JP 2008 016821A
Patent Document 3: JP 2012 129520A

SUMMARY OF THE INVENTION

Problems to be Solved by the Invention

By the way, in manufacturing a semiconductor device utilizing EUV lithography, the lithography is performed in a high vacuum, and impurities, such as carbon, may be deposited on the above-described reflective mask when being irradiated with an EUV light or after being irradiated with an EUV light. For this reason, after the lithography, the resultant reflective mask must be cleaned. Further, generally, the reflective mask is repeatedly used, and therefore cleaning for the mask is repeatedly conducted.

For this reason, the reflective mask is required to have a satisfactory cleaning resistance. The protective film is formed on a portion of the reflective mask in which the absorber film pattern is not formed, and therefore both the absorber film pattern and the protective film are required to have a cleaning resistance.

However, according to the studies conducted by the present inventor, it has been found that, with respect to the reflective mask having the conventional construction as described in Patent Documents 1 to 3 above, when cleaning for the mask according to general RCA cleaning is conducted a plurality of times, stripping of the Ru protective film on the multilayer reflective film in the exposed reflective region occurs. The reason for this is as follows. Specifically, in the construction described in Patent Documents 1 to 3, Si migrates from the Si layer in the multilayer reflective film toward the Ru protective film and diffuses through the grain boundary in the Ru protective film with the passage of time (and then forms Ru silicide [RuSi]), and reaches the surface layer of the Ru protective film and suffers oxidation reaction due to a cleaning agent or gas to form $SiO_2$, or, when the protective film is not dense, a cleaning agent or gas penetrates the protective film, so that $SiO_2$ is formed within the protective film (inside of or the lower portion of the protective film). The adhesion between Ru and $SiO_2$ is poor so that these are separated to cause stripping.

The occurrence of the above-described stripping of film causes further dust or causes the reflectance to be non-uniform, and, in such a case, there is a danger that, upon transferring a pattern onto a semiconductor substrate, the pattern cannot be accurately transferred, and this is a serious problem.

Accordingly, the first object of the present invention is to provide a substrate with a multilayer reflective film, which gives a reflective mask achieving high reflectance and exhibiting excellent cleaning resistance. The second object is to provide a substrate with a multilayer reflective film, which gives a reflective mask having such excellent cleaning resistance that a high reflectance is maintained and no stripping of the film occurs even after the repeated cleaning for the mask. The third object is to provide a reflective mask blank for EUV lithography manufactured using the above substrate with a multilayer reflective film, for example, a reflective mask for EUV lithography obtained from the mask blank and a method of manufacturing the same, and a method of manufacturing a semiconductor device using the reflective mask.

Means to Solve the Problems

The present inventor has made studies with a view toward solving the above-described problems, and thought that it is difficult to prevent Si from coming in contact with gas or a cleaning agent and being oxidized to form $SiO_2$, and therefore it is the most important to suppress the diffusion of Si into the Ru protective film.

As a result of the studies actually made, it has been found that when Ti in a predetermined amount is added to the Ru protective film, Ti and Si together form a strong silicide and Si is fixed at that position of the silicide. Therefore, it is possible to suppress the diffusion of Si into a place in the Ru protective film where Si could be oxidized, so that there can be obtained a reflective mask for EUV lithography which suppresses stripping of the Ru protective film and has a satisfactory resistance to the repeated cleaning, and the present invention has been completed.

Specifically, for solving the above-described problems, the present invention has the following configurations.

(Configuration 1)

A substrate with a multilayer reflective film, having: a substrate; a multilayer reflective film, formed on the substrate, having a layer comprising Si as a high refractive-index material and a layer comprising a low refractive-index material, wherein the layers are periodically laminated; and a Ru protective film, formed on the multilayer reflective film, for protecting the multilayer reflective film, wherein the surface layer on the other side of the multilayer reflective film opposite from the substrate is the layer comprising Si, and wherein the Ru protective film comprises a Ru compound comprising Ru and Ti, wherein the Ru compound contains Ru in an amount greater than that in the stoichiometric composition of RuTi.

As described in Configuration 1 above, in the substrate with a multilayer reflective film having a multilayer reflective film using Si as a high refractive-index material, wherein the top surface of the multilayer reflective film is the layer comprising Si, and a Ru protective film comprising Ti in a specific amount is formed on the top surface, Si in the top surface of the multilayer reflective film is prevented from diffusing into a place in the Ru protective film where Si could be oxidized, suppressing the formation of a silicon oxide (such as $SiO_2$). Thus, there can be obtained a substrate with a multilayer reflective film, which is an original form for manufacturing a reflective mask for EUV lithography having excellent cleaning resistance.

Further, by virtue of the above configuration, there can be obtained a substrate with a multilayer reflective film, which is an original form for manufacturing a reflective mask for EUV lithography maintaining high reflectance for an EUV light even after repeatedly cleaning the reflective mask for EUV lithography.

(Configuration 2)

The substrate with a multilayer reflective film according to Configuration 1, wherein the Ru compound in the Ru protective film has diffraction peaks appear mainly at (100) and (110), as measured by an In-Plane measurement method for X-ray diffractometry.

As described in Configuration 2 above, when diffraction peaks appear mainly at (100) and (110), as measured by X-ray diffractometry for the Ru compound in the Ru protective film by an In-Plane measurement method, that is, the Ru compound has an orientation plane mainly at (001) plane, the diffusion of Si from the Si layer of the multilayer reflective film and the penetration of a cleaning agent or gas into the protective film are suppressed. Thus, there can be obtained a substrate with a multilayer reflective film, which is an original form for manufacturing a reflective mask for EUV lithography having further excellent cleaning resistance.

(Configuration 3)

The substrate with a multilayer reflective film according to Configuration 1 or 2, wherein the Ru ratio in the Ru compound is more than 95 to less than 100 at %.

As described in Configuration 3 above, in the present invention, even when the Ru ratio in the Ru compound is in the range of from more than 95 to less than 100 at % so that the amount of Ti added is reduced, a satisfactory effect of suppressing the diffusion of Si can be obtained. Thus, high transmittance of the Ru protective film due to Ru can be achieved.

(Configuration 4)

The substrate with a multilayer reflective film according to any one of Configurations 1 to 3, wherein a Ru content of an upper layer portion of the Ru protective film is greater than a Ru content of a lower layer portion on the substrate side.

As described in Configuration 4 above, in the present invention, by employing the configuration in which the Ru content of the upper layer portion of the Ru protective film is greater than the Ru content of the lower layer portion on the substrate side, there can be obtained a substrate with a multilayer reflective film, which is an original form for manufacturing a reflective mask for EUV lithography that has satisfactory cleaning resistance such that, even after repeatedly cleaning the reflective mask for EUV lithography, stripping of the Ru protective film is prevented, and which can maintain high reflectance for an EUV light after the repeated cleaning.

(Configuration 5)

The substrate with a multilayer reflective film according to any one of Configurations 1 to 4, the substrate with a multilayer reflective film further comprising a film comprising a silicon oxide provided between the multilayer reflective film and the Ru protective film.

As described in Configuration 5 above, when a film comprising a silicon oxide is formed between the multilayer reflective film and the Ru protective film, the silicon oxide functions as a barrier against the diffusion of Si into the Ru protective film, and further the adhesion between the film comprising the silicon oxide and the Ru protective film is excellent and therefore, excellent resistance to the repeated cleaning due to the suppression of diffusion of Si, which is the effect of the present invention, is more remarkably exhibited.

(Configuration 6)

The substrate with a multilayer reflective film according to any one of Configurations 1 to 5, wherein the low refractive-index material is Mo.

As described in Configuration 6 above, to achieve excellent reflectance for an EUV light, Mo is preferred as the low refractive-index material in the layer comprising the low refractive-index material constituting the multilayer reflective film.

(Configuration 7)

A reflective mask blank for EUV lithography, having the substrate with a multilayer reflective film according to any one of Configurations 1 to 6, and an absorber film, formed on the Ru protective film in the substrate with a multilayer reflective film, for absorbing an EUV light.

As described in Configuration 7 above, the reflective mask blank for EUV lithography of the present invention has a configuration in which an absorber film for absorbing an EUV light is formed on a Ru protective film in the substrate with a multilayer reflective film of the present invention.

(Configuration 8)

The reflective mask blank for EUV lithography according to Configuration 7, further comprising a resist film on the absorber film.

As described in Configuration 8 above, the reflective mask blank for EUV lithography of the present invention includes an embodiment further having a resist film on the absorber film.

(Configuration 9)

A method of manufacturing a reflective mask for EUV lithography, the method comprising patterning an absorber film in the reflective mask blank for EUV lithography according to Configuration 8 with the resist film to form an absorber film pattern on the Ru protective film.

As described in Configuration 9 above, by patterning an absorber film in the reflective mask blank for EUV lithography of the present invention with the resist film, an absorber film pattern is formed on the Ru protective film. By performing the above step, a reflective mask for EUV lithography of the present invention having excellent cleaning resistance can be obtained.

(Configuration 10)

A reflective mask for EUV lithography, the reflective mask comprising the substrate with a multilayer reflective film according to any one of Configurations 1 to 6, and an absorber film pattern, formed on the Ru protective film in the substrate with a multilayer reflective film, for absorbing an EUV light.

As described in Configuration 10 above, the reflective mask for EUV lithography of the present invention has a configuration having the substrate with a multilayer reflective film of the present invention, and an absorber film pattern, formed on a Ru protective film in the substrate with a multilayer reflective film, for absorbing an EUV light.

(Configuration 11)

A method of manufacturing a semiconductor device, the method comprising forming a transfer pattern on a semiconductor substrate using a reflective mask for EUV lithography obtained by the method of manufacturing a reflective mask for EUV lithography according to Configuration 9 or using the reflective mask for EUV lithography according to Configuration 10.

As described in Configuration 11 above, using a reflective mask for EUV lithography obtained by the method of manufacturing a reflective mask for EUV lithography of the present invention or using the reflective mask for EUV lithography of the present invention, a transfer pattern is formed on a semiconductor substrate, and subjected to other various steps, so that various types of semiconductor devices can be manufactured.

Effect of the Invention

In the present invention, there is provided a substrate with a multilayer reflective film, which gives a reflective mask achieving high reflectance and exhibiting excellent cleaning resistance, and there is provided a substrate with a multilayer reflective film, which gives a reflective mask maintaining high reflectance for an EUV light even after repeatedly cleaning the reflective mask, and exhibiting excellent cleaning resistance, and further there are provided a reflective mask blank for EUV lithography manufactured using the above substrate with a multilayer reflective film, for example, a reflective mask for EUV lithography obtained from the mask blank and a method of manufacturing the same, and a method of manufacturing a semiconductor device using the reflective mask.

MODE FOR CARRYING OUT THE INVENTION

Hereinbelow, the present invention will be described in detail. In the present specification, the word "on" as used in the expression, for example, "the second film on the first film" is not used only for indicating a case in which the second film formed on the first film is in contact with the upper surface of the first film, but includes a case in which the second film is formed above the first film and separate from the first film, and is used to have meanings encompassing a case in which a layer is present between the first and second films.

[Substrate with a Multilayer Reflective Film]

Figure 1:
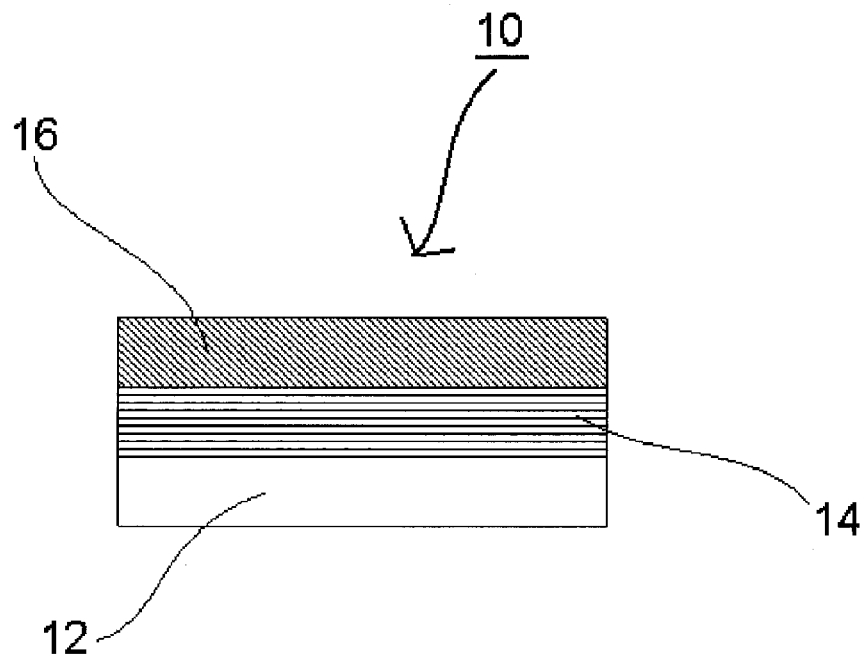
FIG. 1: A schematic diagram showing the cross-section of the substrate with a multilayer reflective film of the present invention.

FIG. 1 is a schematic diagram showing the cross-section of the substrate with a multilayer reflective film of the present invention. A substrate with a multilayer reflective film 10 comprises, on a substrate 12, a multilayer reflective film 14 for reflecting an EUV light which is an exposure light, and a Ru protective film 16, formed on the multilayer reflective film 14, for protecting the multilayer reflective film 14.

<Substrate 12>

With respect to the substrate 12 used in the substrate with a multilayer reflective film 10 of the present invention, in the case of EUV exposure, for preventing the absorber film pattern from suffering strain due to heat during the exposure, one having a low thermal expansion coefficient in the range of 0±5 ppb/° C. is preferably used. As a material having a low thermal expansion coefficient in the above range, for example, $SiO_2$—$TiO_2$ glass or a multicomponent glass ceramic can be used.

The main surface of the substrate 12 on the side on which a transfer pattern (which the below-described absorber film constitutes) is to be formed has been subjected to surface processing so that the main surface has high flatness from the viewpoint of obtaining at least pattern transfer precision and positional precision. For example, in the case of EUV exposure, in a region of 132 mm×132 mm of the main surface of the substrate 12 on the side on which a transfer pattern is to be formed, the flatness is preferably 0.1 μm or less, further preferably 0.05 μm or less, especially preferably 0.03 μm or less. Further, the main surface on the other side of the surface on which a transfer pattern is to be formed is a surface held by an electrostatic chuck when being set in an exposure machine, and, in a region of 142 mm×142 mm of this main surface, the flatness is 1 μm or less, further preferably 0.5 μm or less, especially preferably 0.03 μm or less. In the present specification, the flatness is a value representing warpage of the surface (deformation) indicated by TIR (Total Indicated Reading), and is an absolute value of a height difference between the highest position of the surface of the substrate present above the focal plane and the lowest position of the surface of the substrate present below the focal plane, wherein the focal plane is a plane determined by a method of least squares using the surface of the substrate as a reference.

In the case of EUV exposure, with respect to the surface smoothness required for the substrate 12, the surface roughness of the main surface of the substrate 12 on which a transfer pattern is to be formed, in terms of a root mean square (RMS) roughness, is preferably 0.1 nm or less. The surface smoothness can be measured by means of an atomic force microscope.

Further, as the substrate 12, for preventing the substrate from suffering deformation due to the film stress of a film (such as the multilayer reflective film 14) which is formed on the substrate, one having a high stiffness is preferred. Particularly, a substrate having a Young's modulus as high as 65 GPa or more is preferred.

<Multilayer Reflective Film 14>

In the substrate with a multilayer reflective film 10 of the present invention, a multilayer reflective film 14 is formed on the above-described substrate 12. The multilayer reflective film 14 imparts a function of reflecting an EUV light to a reflective mask for EUV lithography, and has a construction of a multilayer film in which layers of elements having different refractive indices are periodically laminated.

Generally, a multilayer film in which a thin film of a light element, which is a high refractive-index material, or a compound thereof (high refractive-index layer) and a thin film of a heavy element, which is a low refractive-index material, or a compound thereof (low refractive-index layer) are alternately laminated in about 40 to 60 cycles of the layers is used as the above-described multilayer reflective film 14. The multilayer film may be one in which a high refractive-index layer/low refractive-index layer laminated structure, which is formed by laminating the high refractive-index layer and the low refractive-index layer in this order from the substrate 12 side, is taken as one cycle and the layers are laminated in multiple cycles, or one in which a low refractive-index layer/high refractive-index layer laminated structure, which is formed by laminating the low refractive-index layer and the high refractive-index layer in this order from the substrate 12 side, is taken as one cycle and the layers are laminated in multiple cycles.

The layer of the top surface of the multilayer reflective film 14, that is, the surface layer of the multilayer reflective film 14 opposite from the substrate 12 is a high refractive-index layer. In the above-described multilayer film, when a high refractive-index layer/low refractive-index layer laminated structure, which is formed by laminating the high refractive-index layer and the low refractive-index layer in this order from the substrate 12 side, is taken as one cycle and the layers are laminated in multiple cycles, the low refractive-index layer constitutes the uppermost layer of the multilayer film. When the low refractive-index layer constitutes the top surface of the multilayer reflective film 14, the low refractive-index layer is easily oxidized to reduce the reflectance of the reflective mask, and therefore the high refractive-index layer is formed on the low refractive-index layer as the uppermost layer of the multilayer film to form the multilayer reflective film 14. Further, in the above-described multilayer film, when a low refractive-index layer/high refractive-index layer laminated structure, which is formed by laminating the low refractive-index layer and the high refractive-index layer in this order from the substrate 12 side, is taken as one cycle and the layers are laminated in multiple cycles, the high refractive-index layer constitutes the uppermost layer of the multilayer film, and therefore, in this case, the high refractive-index layer as the uppermost layer of the multilayer film constitutes the top surface of the multilayer reflective film 14.

In the present invention, a layer comprising Si is employed as the high refractive-index layer. Examples of materials comprising Si include Si simple substance, and Si compounds comprising Si, and B, C, N, or O. By using the layer comprising Si as a high refractive-index layer, a reflective mask for EUV lithography having excellent reflectance for EUV light is obtained. Further, in the present invention, a glass substrate is preferably used as the substrate 12, and Si has excellent adhesion to the substrate.

As the above-described low refractive-index material, an element selected from Mo, Ru, Rh, and Pt, or an alloy thereof is used. For example, as a multilayer reflective film 14 for EUV light having a wavelength 13 to 14 nm, a Mo/Si periodically laminated film in which a Mo film and a Si film are alternately laminated in about 40 to 60 cycles is preferably used.

The multilayer reflective film 14 solely has generally a reflectance of 65% or more, and the upper limit of the reflectance is generally 73%. The thickness of the individual layers constituting the multilayer reflective film 14 and the cycle of the layers may be appropriately selected according to the wavelength of exposure light, and is selected so as to satisfy the Bragg's law.

In the multilayer reflective film 14, a plurality of high refractive-index layers and a plurality of low refractive-index layers are present, and the thicknesses of the high refractive-index layers may be the same or different, and the thicknesses of the low refractive-index layers may be the same or different. Further, the thickness of the Si layer as the top surface of the multilayer reflective film 14 can be controlled in such range that the reflectance is not reduced. Specifically, the thickness of the Si layer as the top surface can be 3 to 10 nm.

The method for forming the multilayer reflective film 14 is known in the related technical field, and the multilayer reflective film can be formed by depositing the individual layers by, for example, an ion beam sputtering method. In the case of the above-described Mo/Si periodic multilayer film, for example, by an ion beam sputtering method, a Si film having a thickness of about 4 nm is first formed on the substrate 12 using a Si target, and then a Mo film having a thickness of about 3 nm is formed using a Mo target, and a series of the formations of the two films is taken as one cycle, and the films are laminated in 40 to 60 cycles to form the multilayer reflective film 14 (wherein the top surface layer is a Si film).

<Ru Protective Film 16>

A Ru protective film 16 is formed on the above-formed multilayer reflective film 14 for protecting the multilayer reflective film 14 from dry etching and cleaning in the below-described process for manufacturing a reflective mask for EUV lithography, completing the substrate with a multilayer reflective film 10.

In a conventional reflective mask, a protective film is formed on the multilayer reflective film, and, from the viewpoint of suppressing the formation of a diffused layer between the Si layer and the protective film, a protective film comprising a Ru alloy having Zr or B added to Ru has been proposed. However, suppression of the diffusion of Si even by such a Ru protective film is unsatisfactory, and Si diffuses into the Ru protective film and is oxidized to form a silicon oxide (such as $SiO_2$), which causes stripping of the film when being subjected to repeated cleaning during the process for manufacturing a reflective mask or during the use as a finished product.

Further, a silicon oxide is unlikely to have Si passed through it, and therefore the formation of an intermediate layer containing a silicon oxide between the Mo/Si multilayer reflective film and the Ru protective film can be considered. However, according to the studies conducted by the present inventor, the above intermediate layer has such unsatisfactory adhesion to the Ru protective film that stripping of the film occurs at the bonded portion.

The fact that Si is oxidized or that the adhesion between a silicon oxide (such as $SiO_2$) and the existing Ru protective film is unsatisfactory is very difficult to avoid, and therefore, in the present invention, a protective film comprising a Ru compound having Ti in a predetermined amount added to Ru is employed. It is considered that Ti and Si together form a strong silicide and the migration of Si is stopped at that portion of the silicide, so that diffusion of Si into the Ru protective film is suppressed.

More specifically, it is considered that Si diffuses into the Ru protective film, but is captured by Ti before reaching the position where Si could be oxidized to form a silicon oxide. The formed Ti silicide has excellent adhesion to the Ru compound. Therefore, by forming the Ru protective film in the present invention, Si can be prevented from diffusing into the Ru protective film and being in contact with gas or a cleaning agent to form a silicon oxide (such as $SiO_2$), causing stripping of the film, and further stripping of film between the Ti silicide and the Ru compound is very unlikely to be caused, making it possible to obtain a reflective mask having high reflectance and excellent cleaning resistance.

The Ru protective film 16 employed in the present invention comprises a Ru compound comprising Ru and Ti in predetermined amounts. More specifically, the amount of Ru in the Ru compound is greater than that in the stoichiometric composition of RuTi. When the amount of Ru in the Ru compound is greater than that in the stoichiometric composition of RuTi, while satisfactorily achieving the effect of suppressing the diffusion of Si into the Ru protective film, excellent transmittance (the entering EUV light passes through the Ru protective film 16 and then is reflected by the multilayer reflective film 14, and the reflected light passes through the Ru protective film 16 to be emitted), which is basic performance of the protective film, can be secured simultaneously. From this point of view, the Ru ratio in the Ru compound is preferably more than 50 to less than 100 at %, further preferably 80 to less than 100 at %, especially preferably more than 95 to less than 100 at %.

Further, the Ru compound may comprise at least one element of nitrogen (N), oxygen (O), and carbon (C) in such an amount that the effects of the present invention are not sacrificed. When at least one element of nitrogen, oxygen, and carbon is contained, from the viewpoint of the reflectance with respect to an EUV light, the total content of the elements in the compound is preferably 10 at % or less, further preferably 5 at % or less.

Further, from the viewpoint of improving the cleaning resistance, it is preferred that diffraction peaks appear mainly at (100) and (110), as measured by X-ray diffractometry for the Ru compound in the above-described Ru protective film 16 by an In-Plane measurement method, that is, the Ru compound has an orientation plane mainly at (001) plane.

In the present invention, the expression "diffraction peaks appear mainly at (100) and (110)" means a state in which diffraction peaks appear at (100) and (110) as measured by an In-Plane measurement method for X-ray diffractometry, and there are no other diffraction peaks appearing at, for example, (102), (103), and (112), or the above other diffraction peaks are satisfactorily low. A state in which there are diffraction peaks appearing at, e.g., (102), (103), and (112) in addition to the diffraction peaks appearing at (100) and (110) is defined as random orientation. Further, the state in which "diffraction peaks appear mainly at (100) and (110)" includes a state in which there are secondary diffraction peaks {(200), (220)} or tertiary diffraction peaks {(300), (330)} for (100) and (110).

Figure 6:
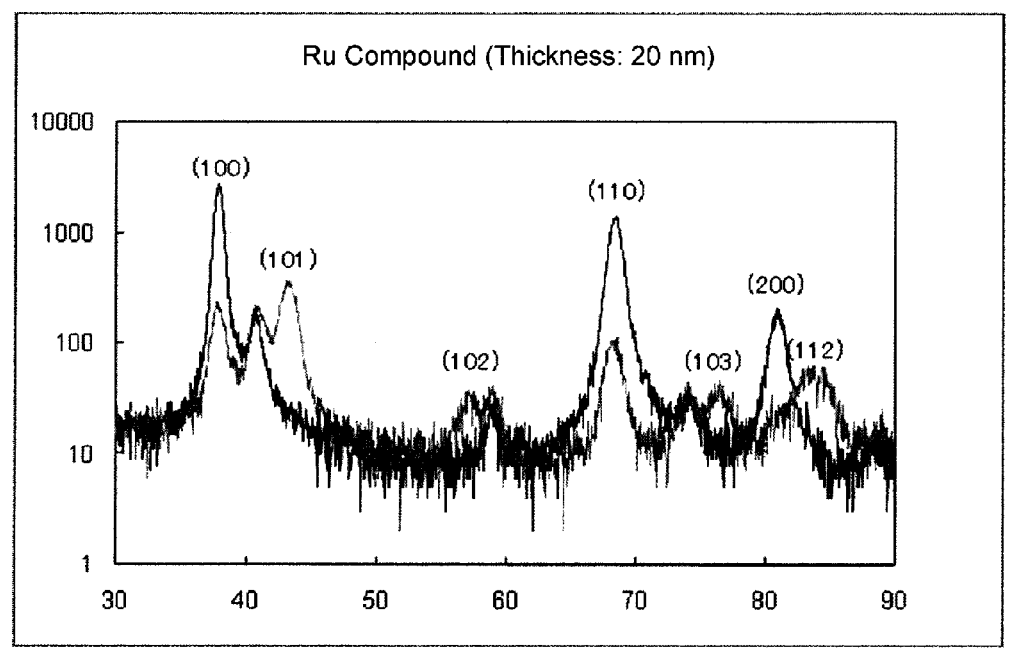
FIG. 6: X-ray diffraction data measured by an In-Plane measurement method for X-ray diffractometry with respect to samples obtained by depositing the Ru compound used in the present invention on the multilayer reflective film by different deposition methods.

FIG. 6 shows X-ray diffraction data measured by an In-Plane measurement method for X-ray diffractometry with respect to samples obtained by depositing the Ru compound used in the present invention (thickness: 20 nm) on the multilayer reflective film 14 by different deposition methods. The black spectrum is a spectrum of the Ru compound preferably used in the present invention, in which diffraction peaks appear mainly at (100) and (110) {namely, which has an orientation plane at (001) plane}. The gray spectrum is a spectrum of a Ru compound of a random orientation having diffraction peaks appearing at, e.g., (102), (103), and (112) in addition to the diffraction peaks appearing at (100) and (110).

When diffraction peaks appear mainly at (100) and (110) as measured for the Ru compound in the Ru protective film 16 by an In Plane method, the particles of the Ru compound are deposited on the multilayer reflective film 14 so that the (001) planes of the particles are uniformly arranged along the horizontal direction of the substrate 12. Therefore, the diffusion of Si from the Si layer of the multilayer reflective film 14 and the penetration of a cleaning agent or gas into protective film 16 are suppressed, so that the reflective mask is further improved in the cleaning resistance. In contrast, in the case of random orientation, the crystal particles of the Ru compound are deposited on the multilayer reflective film 14 in a state such that the orientation of the crystal particles is random, and therefore an effect of improving the cleaning resistance due to the orientation of the Ru compound is unlikely to be obtained.

With respect to the thickness of the Ru protective film 16, there is no particular limitation as long as the multilayer reflective film 14 can be satisfactorily protected, and further Si migrating from the multilayer reflective film 14 and Ti together form a silicide, making it possible to suppress the diffusion of Si into the Ru protective film 16 to leave Si in a position at a relatively lower portion of protective film 16 where Si is not oxidized to form a silicon oxide.

From the above point of view and the viewpoint of the transmittance for EUV light, the thickness of the Ru protective film 16 is preferably 1.2 to 8.5 nm, more preferably 1.5 to 8 nm, further preferably 1.5 to 6 nm.

Further, the flatness of the substrate with a multilayer reflective film 10 of the present invention, as measured with respect to a region of 132 mm×132 mm in the middle of the substrate on the Ru protective film 16 side, is generally 750 nm or less, preferably 500 nm or less, further preferably 350 nm or less. In the present invention, a heating treatment may be conducted in, for example, the below-described control of the Ru content of the Ru protective film 16, and the flatness can be enhanced by the heating treatment without sacrificing the transmittance of the Ru protective film 16. The heating treatment may be independently conducted before forming the Ru protective film 16.

Further, when the Ru content of the upper layer portion of the Ru protective film 16 on the exposed surface side (on which the below-described absorber film 20 is to be formed) is greater than the Ru content of the lower layer portion of the Ru protective film 16 on the substrate 12 side, there can be obtained a substrate with a multilayer reflective film, which is an original form for manufacturing a reflective mask for EUV lithography which has satisfactory cleaning resistance such that, even after repeatedly cleaning the reflective mask for EUV lithography, stripping of the Ru protective film 16 is prevented, and which can maintain the reflectance for an EUV light at a high value after the repeated cleaning. The lower layer portion and the upper layer portion are determined from the nearly central portion as viewed in substantially the direction toward the thickness of the Ru protective film 16 as a reference.

To achieve the construction in which the Ru content of the upper layer portion of the Ru protective film 16 is greater than the Ru content of the lower layer portion on the substrate 12 side, the Ru content can be increased stepwise and/or continuously toward the upper layer portion from the lower layer portion.

For a stepwise increase in the Ru content toward the upper layer portion from the lower layer portion, using a Ru compound having different compositions (Ru content of the lower layer portion<Ru content of the upper layer portion), the compounds are stepwise deposited.

For a continuous increase in the Ru content toward the upper layer portion from the lower layer portion, the substrate 12 is heated after or when depositing the Ru compound. When the substrate 12 is heated so as to continuously increase the Ru content toward the upper layer portion from the lower layer portion, the heating temperature is 150 to 300° C., further preferably 180 to 250° C.

By virtue of the construction of the present invention, in which the Ru protective film 16 contains Ru in an amount greater than that in the stoichiometric composition of RuTi, the temperature of the heating of the substrate 12 performed for the purpose of reducing the film stress of the multilayer reflective film 14 (which is considered to consequently cause the above-described flatness of the substrate with a multilayer reflective film 10 to be excellent) can be set at the above-stated high temperature (150 to 300° C.) (even when heating the substrate, the transmittance of the Ru protective film 16 is substantially not lowered). Therefore, the above-described heating for adjusting the Ru content of the Ru protective film 16 is preferred also from the viewpoint of reducing the stress of the multilayer reflective film 14. The heating time is generally about 5 to 60 minutes.

Further, as an alternative method of continuously increasing the Ru content toward the upper layer portion from the lower layer portion, the following may be employed. Specifically, when depositing the Ru compound, a Ru target and a Ti target, or a RuTi target having different compositions are placed opposite to the substrate 12. When depositing the Ru compound by a sputtering method, in an ion beam sputtering method, the intensity of the ion beam emitted to each target is changed over time, or in a DC or RF sputtering method, the voltage or current applied to each target is changed over time. Thus, the Ru content can be continuously increased toward the upper layer portion from the lower layer portion.

When the Ru content of the upper layer portion of the Ru protective film 16 is greater than the Ru content of the lower layer portion as described above, the reflective mask for EUV lithography can maintain the reflectance for an EUV light at a high value even after repeated cleaning of the reflective mask for EUV lithography. In addition, the lower layer portion contains Ti in a relatively large amount, and hence Si migrating from the multilayer reflective film 14 and Ti together form a silicide, where the Ti captures Si, and therefore the mask can achieve a satisfactory cleaning resistance such that stripping of the Ru protective film 16 is prevented.

Further, as described above, in the present invention, the migration of Si from the multilayer reflective film 14 to the Ru protective film 16 can occur (and diffusion of Si into a position where the problem of stripping of the film arises is suppressed). For this reason, immediately after manufacture of the substrate with a multilayer reflective film 10 of the present invention, the boundary between the multilayer reflective film 14 and the Ru protective film 16 is considered definite, and it is considered that, after being subjected to the above-described heating treatment or subjected to the process for manufacturing a reflective mask blank for EUV lithography subsequent to the formation of the Ru protective film 16, or when being used as a reflective mask for EUV lithography, the above-described migration of Si occurs, so that the boundary between the multilayer reflective film 14 and the Ru protective film 16 becomes indefinite.

In the present invention, as a method for forming the above-described Ru protective film 16, one similar to a conventional method for forming a protective film can be employed without any particular limitation. Examples of such methods for forming a protective film include magnetron sputtering methods, such as a DC sputtering method and an RF sputtering method, and an ion beam sputtering method. For example, by controlling the amount ratio of the Ru target and Ti target used in the above method, the ratio of the predetermined constituent elements of the Ru compound in the present invention can be achieved.

Further, when an orientation is made in the Ru compound as described above, the film is deposited by sputtering so that the angle of incidence of the Ru compound particles to the normal of the surface of the multilayer reflective film 14 is 0 to 45 degrees, preferably 0 to 35 degrees, preferably 0 to 30 degrees. With respect to the method for forming the protective film, the film is preferably formed by an ion beam sputtering method.

<Film Comprising a Silicon Oxide 18>

Figure 2:
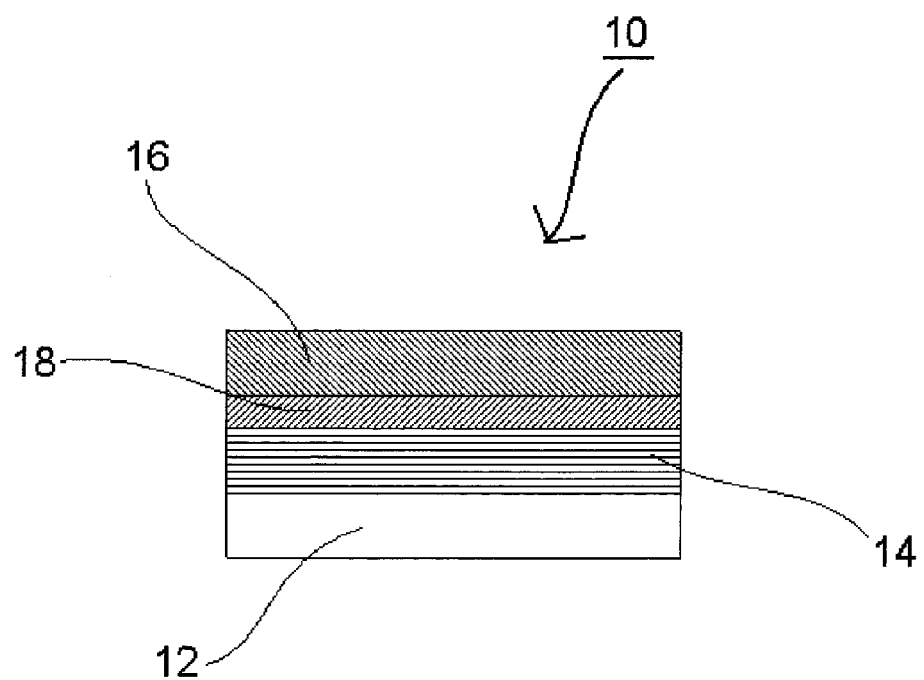
FIG. 2: A schematic diagram showing the cross-section of a substrate with a multilayer reflective film according to an embodiment of the present invention which has a film comprising a silicon oxide.

In the substrate with a multilayer reflective film 10 of the present invention, the film comprising a silicon oxide 18 may be formed between the multilayer reflective film 14 and the Ru protective film 16 (see FIG. 2). FIG. 2 is a schematic diagram showing the cross-section of the substrate with a multilayer reflective film 10 according to an embodiment of the present invention, which has the film comprising a silicon oxide 18.

The silicon oxide has excellent barrier performance to Si, and, by disposing the silicon oxide between the multilayer reflective film 14 and the Ru protective film 16, the diffusion of Si from the multilayer reflective film 14 into the Ru protective film 16 can be more effectively suppressed.

Specific examples of the silicon oxides include $SiO_2$ and oxygen-rich SiO. The protective film comprising, e.g., RuNb or RuZr conventionally used has poor adhesion to a silicon oxide, and therefore, when a film comprising a silicon oxide is formed on such a protective film, stripping of the film occurs at the interface between the film comprising a silicon oxide and the protective film. The Ru protective film 16 employed in the present invention, however, has excellent adhesion to a silicon oxide, and hence stripping of the film due to a lack of the adhesion is suppressed.

With respect to the thickness of the film comprising a silicon oxide 18 having Si barrier performance, there is no particular limitation as long as the barrier performance can be exhibited, but the thickness is generally 0.2 to 3 nm, preferably 0.5 to 2 nm.

The above-described the film comprising a silicon oxide 18 is formed by, for example, a method in which the Si film as the top surface of the multilayer reflective film 14 is exposed to an oxygen atmosphere, a method in which the Si film as the top surface of the multilayer reflective film 14 is subjected to annealing in an oxygen atmosphere or in air at a predetermined temperature, a method in which a film comprising a silicon oxide is deposited on the Si film as the top surface of the multilayer reflective film 14 by DC or RF sputtering using a Si target in an atmosphere of mixed gas of an inert gas, such as Ar gas, and oxygen gas, or a method in which a film comprising a silicon oxide is deposited on the Si film as the top surface of the multilayer reflective film 14 by RF sputtering using a $SiO_x$ target in an atmosphere of mixed gas of an inert gas, such as Ar gas, and oxygen gas.

As described above, the substrate with a multilayer reflective film 10 of the present invention has the substrate 12, the multilayer reflective film 14, and the Ru protective film 16. In the substrate with a multilayer reflective film 10, by virtue of having a predetermined composition of the Ru protective film 16 (preferably further, by virtue of having a difference of the Ru content between the upper layer portion and the lower layer portion), stripping of protective film 16 is suppressed, and, while achieving high reflectance, specifically, a reflectance of 63% or more with respect to EUV light having a wavelength of 13.5 nm, excellent cleaning resistance is exhibited. Further, as described above, by forming the film comprising a silicon oxide 18 between the multilayer reflective film 14 and the Ru protective film 16, the cleaning resistance can be further improved.

Further, the substrate with a multilayer reflective film 10 may have a back side conductive film on the main surface of the substrate 12 opposite from the surface on which the multilayer reflective film 14 is formed. The back side conductive film is formed to adsorb the substrate with a multilayer reflective film 10 or a mask blank on an electrostatic chuck used as supporting means for the substrate with a multilayer reflective film 10 when manufacturing a mask blank, or on an electrostatic chuck used as supporting means for mask handling during the pattern process or exposure for the below-described reflective mask blank for EUV lithography of the present invention. The back side conductive film is formed also for the purpose of stress correction of the multilayer reflective film 14.

Further, in the substrate with a multilayer reflective film 10 of the present invention, a base film may be formed between the substrate 12 and the multilayer reflective film 14. The base film is formed to improve the smoothness of the surface of the substrate 12, to reduce defects, to enhance reflectivity for the multilayer reflective film 14, to secure the conduction properties, and for the purpose of stress correction of the multilayer reflective film 14.

Further, the substrate with a multilayer reflective film 10 of the present invention includes an embodiment in which a resist film is formed on the multilayer reflective film 14 or the Ru protective film 16 when a fiducial mark as a reference for the defect position in the substrate 12 or the substrate with a multilayer reflective film 10 is formed by photolithography on the multilayer reflective film 14 or the Ru protective film 16.

[Reflective Mask Blank 30 for EUV Lithography]

Figure 3:
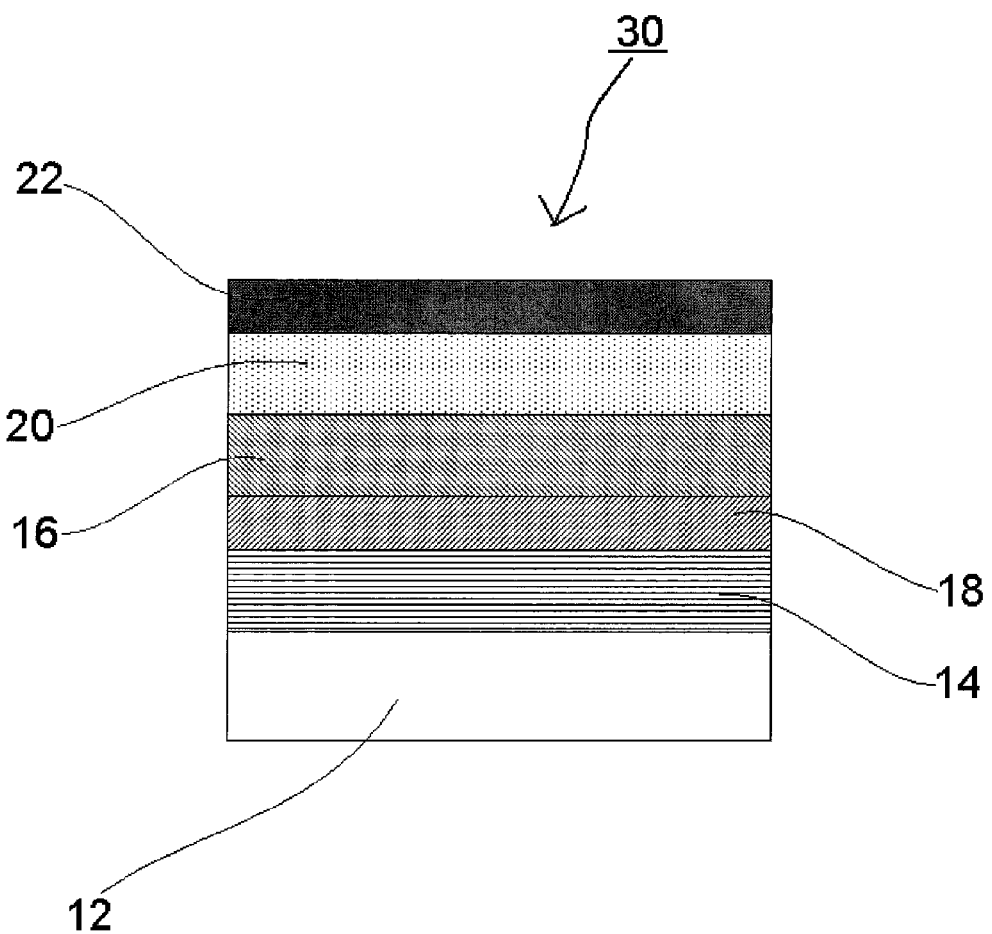
FIG. 3: A schematic diagram showing the cross-section of the reflective mask blank for EUV lithography of the present invention.

FIG. 3 is a schematic diagram showing the cross-section of a reflective mask blank 30 for EUV lithography of the present invention (in FIG. 3, the embodiment having the film comprising a silicon oxide 18 is shown). Mask blank 30 of the present invention can be obtained by forming an absorber film 20 for absorbing an EUV light on the Ru protective film 16 in the above-described the substrate with a multilayer reflective film 10 of the present invention.

Absorber film 20 has a function of absorbing EUV light, which is used as exposure light, and, in a reflective mask 40 for EUV lithography (also see FIG. 4), which is formed using the reflective mask blank 30 for EUV lithography, the absorber film may be one having a desired reflectance difference between the light reflected by the above-described multilayer reflective film 14 and the Ru protective film 16 and the light reflected by an absorber film pattern 20a.

For example, the reflectance of the absorber film 20 with respect to an EUV light is selected from 0.1 to 40%. In addition to the above-described reflectance difference, a desired phase difference may be present between the light reflected by the multilayer reflective film 14 and the Ru protective film 16 and the light reflected by the absorber film pattern 20a. When a desired phase difference is present between the above reflected lights, the absorber film 20 in the reflective mask blank 30 for EUV lithography is also called a phase shift film. When a desired phase difference is caused between the light reflected by the multilayer reflective film 14 and the Ru protective film 16 and the light reflected by the absorber film pattern 20a to improve the resultant reflective mask in the contrast of reflected light, the phase difference is preferably set to be in the range of 180±10 degrees, and the reflectance of the absorber film 20 is preferably set to be from 1.5 to 40%.

As described above, the reflective mask blank 30 for EUV lithography of the present invention includes an embodiment in which the absorber film 20 is a phase shift film such that a predetermined phase difference is present between the light reflected by the multilayer reflective film 14 and the Ru protective film 16 and the light reflected by the absorber film 20.

The above-described absorber film 20 may be of either a single layer or a laminated structure. In the case of a laminated structure, the structure may be either a laminated film of the same material or a laminated film of different materials. With respect to the composition of the film, the material or composition can be changed stepwise and/or continuously in the direction toward the thickness of the film.

By subjecting the absorber film 20 to dry etching with a resist, a predetermined absorber film pattern is obtained, so that a reflective mask for EUV lithography having portions (the Ru protective film 16 and a portion under the protective film through which the multilayer reflective film 14 [and optionally the film comprising a silicon oxide 18] is exposed) that reflect light (EUV light in the present invention) and a portion (absorber film pattern) which absorbs light is obtained.

With respect to the material for the absorber film 20, there is no particular limitation as long as the material has a function of absorbing an EUV light and can be removed by, e.g., etching (preferably by dry etching with chlorine (Cl) or fluorine (F) gas). As a material having such a function, tantalum (Ta) simple substance or a tantalum compound comprised mainly of Ta can be preferably used.

Absorber film 20 comprising tantalum or a tantalum compound can be formed using a conventional method, such as a magnetron sputtering method, e.g., a DC sputtering method or an RF sputtering method. For example, using a target comprising tantalum and boron, the absorber film 20 can be formed on the Ru protective film 16 by a sputtering method using argon gas having added thereto oxygen or nitrogen.

The tantalum compound is generally an alloy of Ta. With respect to the crystalline state of the absorber film 20, from the viewpoint of the smoothness and flatness, an amorphous or microcrystalline structure is preferred. When the surface of the absorber film 20 is not smooth or flat, the resultant absorber film pattern has a greater edge roughness, so that the dimensional precision of the pattern may become poor.

The surface roughness of the absorber film 20 is preferably 0.5 nm Rms or less, further preferably 0.4 nm Rms or less, further preferably 0.3 nm Rms or less.

As the above-described tantalum compound, for example, a compound comprising Ta and B, a compound comprising Ta and N, a compound comprising Ta, O, and N, a compound comprising Ta and B and further at least one of O and N, a compound comprising Ta and Si, a compound comprising Ta, Si, and N, a compound comprising Ta and Ge, or a compound comprising Ta, Ge, and N can be used.

Ta is a material that has a large absorption coefficient with respect to EUV light, and that can be easily dry-etched by chlorine gas or fluorine gas, and hence is an absorber film material having excellent processability. Further, by using Ta having added thereto, e.g., B, Si, or Ge, an amorphous material is easily obtained, making it possible to obtain the absorber film 20 with improved smoothness. By using Ta having added thereto N or O, the absorber film 20 with an improved resistance to oxidation is obtained, so that an effect is obtained such that the stability with time can be improved.

In addition, by controlling the temperature of heating the substrate upon forming the absorber film 20 or the sputtering gas pressure upon forming the absorber film, the absorber film material which is changed to be microcrystalline can be obtained.

Further, examples of materials constituting the absorber film 20 may include materials, such as WN, TiN, and Ti, in addition to tantalum and tantalum compounds.

The above-described absorber film 20 preferably has an absorption coefficient of 0.025 or more, further preferably 0.030 or more with respect to the wavelength of an exposure light, from the viewpoint of a reduction of the thickness of the absorber film 20.

The thickness of the absorber film 20 may be a thickness that can satisfactorily absorb an EUV light which is an exposure light, but is generally about 30 to 100 nm.

The reflective mask blank 30 for EUV lithography of the present invention includes an embodiment in which a resist film 22 for forming a pattern by dry etching is formed on the above-described absorber film 20.

Further, the reflective mask blank 30 for EUV lithography of the present invention includes an embodiment in which a hard mask film is formed between the above-described absorber film 20 and the resist film 22. The hard mask film has a mask function upon patterning the absorber film 20, and is comprised of a material having an etching selectivity different from that of the absorber film 20. When the absorber film 20 comprises tantalum or a tantalum compound, a material, such as chromium or a chromium compound, is selected for the hard mask film. Examples of the chromium compounds may include materials comprising Cr and at least one element selected from N, O, C, and H.

In the substrate with a multilayer reflective film 10, on the surface of the substrate 12 on the other side of the surface facing the multilayer reflective film 14, a back side conductive film for the purpose of electrostatic chuck as described above may be formed. The electrical properties required for the back side conductive film are generally 100Ω/square or less. The method for forming the back side conductive film is known, and the film can be formed by, for example, a magnetron sputtering method or an ion beam sputtering method using a metal, such as chromium (Cr) or tantalum (Ta), or an alloy thereof as a target. With respect to the thickness of the back side conductive film, there is no particular limitation as long as the above-described purpose is achieved, but the thickness is generally 10 to 200 nm.

As described below, the reflective mask blank 30 for EUV lithography of the present invention is further processed to obtain a reflective mask for EUV lithography, and, with respect to the obtained reflective mask, generally, inspections for pattern and correction are performed. In the case of a reflective mask using an EUV light as an exposure light, as an inspection light used in the inspection for pattern, light having a long wavelength, as compared to EUV light having a wavelength of, for example, 193 nm or 257 nm, is often used. For dealing with an inspection light having a long wavelength, it is necessary to reduce reflection of the light off the surface of the absorber film 20. In this case, the absorber film 20 advantageously has a construction in which an absorber layer, mainly having a function of absorbing EUV light, and a low reflectivity layer, mainly having a function of reducing the reflection of the inspection light off the surface, are laminated from the substrate 12 side. When the absorber layer is formed from a material comprised mainly of Ta, a material having O added to Ta or TaB is preferred as the low reflectivity layer.

[Reflective Mask for EUV Lithography]

Using the above-described reflective mask blank 30 for EUV lithography of the present invention, the reflective mask for EUV lithography of the present invention can be manufactured. In manufacturing the reflective mask for EUV lithography of the present invention, a photolithography method that enables high-definition patterning is most preferred.

Figure 4:
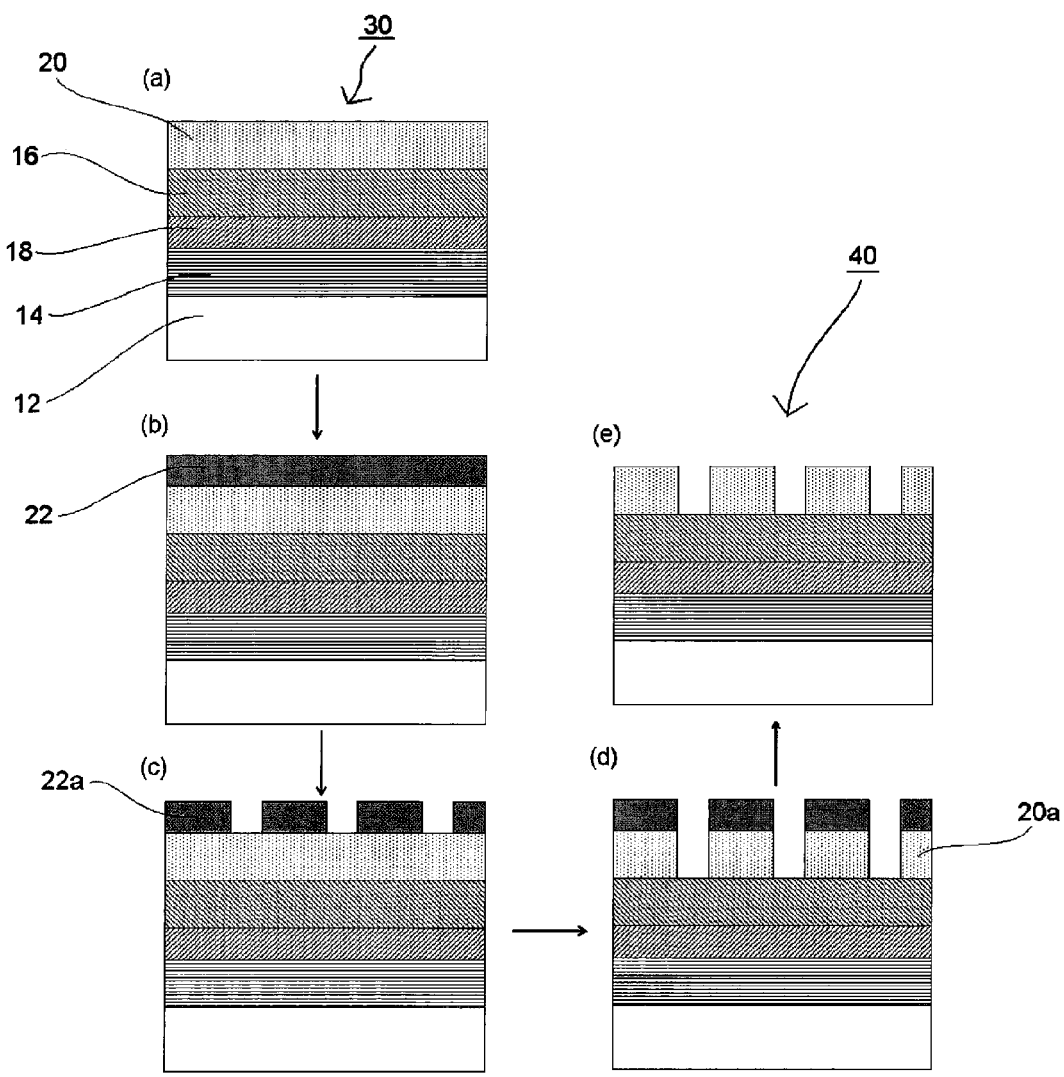
FIG. 4: A schematic diagram showing the method of manufacturing a reflective mask for EUV lithography of the present invention.

Hereinbelow, a method utilizing a photolithography method is described in which the absorber film 20 in the reflective mask blank 30 for EUV lithography is patterned with the resist film 22 to manufacture the reflective mask for EUV lithography of the present invention. A schematic diagram of the method is shown in FIG. 4. In FIG. 4, with respect to the same parts, only one part is indicated by a reference numeral, and indication of the reference numeral for the other same parts is omitted.

First, in mask blank 30 in which the substrate 12, the multilayer reflective film 14, optionally the film comprising a silicon oxide 18, the Ru protective film 16, and the absorber film 20 are formed in this order (FIG. 4(a)), the resist film 22 is formed on the absorber film 20 (FIG. 4(b)). A mask blank in which the resist film 22 has already been formed is also the reflective mask blank 30 for EUV lithography of the present invention, and therefore the method may be started from such a mask blank. A desired pattern is drawn in the resist film 22 (exposure), and further subjected to development and rinsing to form a predetermined resist pattern 22a (FIG. 4(c)).

Using the formed resist pattern 22a as a mask, dry etching using etching gas is conducted to etch a portion of the absorber film 20 that is not covered with the resist pattern 22a, forming the absorber film pattern 20a on the Ru protective film 16 (FIG. 4(d)).

Examples of the etching gases include chlorine gas, such as $Cl_2$, $SiCl_4$, $CHCl_3$, and $CCl_4$, a mixed gas containing a chlorine gas and $O_2$ in a predetermined ratio, a mixed gas containing a chlorine gas and He in a predetermined ratio, a mixed gas containing a chlorine gas and Ar in a predetermined ratio, fluorine gas, such as $CF_4$, $CHF_3$, $C_2F_6$, $C_3F_6$, $C_4F_6$, $C_4F_8$, $CH_2F_2$, $CH_3F$, $C_3F_8$, $SF_6$, and F, a mixed gas containing a fluorine gas and $O_2$ in a predetermined ratio, a mixed gas containing a fluorine gas and He in a predetermined ratio, and a mixed gas containing a fluorine gas and Ar in a predetermined ratio.

Then, the resist pattern 22a is removed using, for example, a resist stripping agent, followed by wet cleaning using an acid or alkaline aqueous solution, obtaining the reflective mask 40 for EUV lithography achieving high reflectance (FIG. 4(e)).

[Method of Manufacturing a Semiconductor Device]

By a lithography technique using the above-described reflective mask 40 for EUV lithography of the present invention, a transfer pattern based on the absorber film pattern 20a in the above-described mask is formed on a semiconductor substrate, and subjected to other various steps, so that a semiconductor device having, e.g., various patterns formed on the semiconductor substrate can be manufactured.

Figure 5:
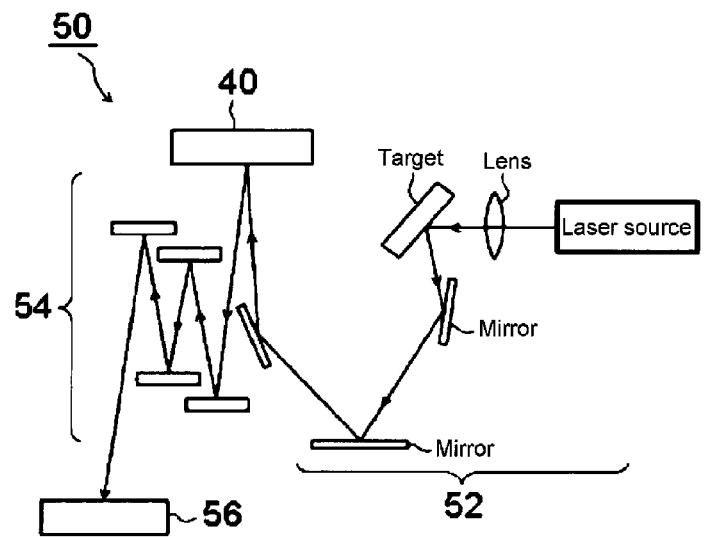
FIG. 5: A schematic diagram showing the step of transferring a pattern to a semiconductor substrate with a resist by a pattern transfer apparatus.

As a more specific example, a method for transferring a pattern to a semiconductor substrate with a resist 56 by means of a pattern transfer apparatus 50 shown in FIG. 5 by an EUV light using the reflective mask 40 for EUV lithography is described.

The pattern transfer apparatus 50 having mounted thereon the reflective mask 40 for EUV lithography substantially comprises a laser plasma X-ray source 52, the reflective mask 40, and a reduction optical system 54. As the reduction optical system 54, an X-ray reflecting mirror is used.

By the reduction optical system 54, the pattern reflected by the reflective mask 40 is reduced generally to about ¼. For example, using a wavelength in the range of 13 to 14 nm as an exposure wavelength, the system is preliminarily set so that the optical path is in a vacuum. In such a condition, an EUV light obtained from the laser plasma X-ray source 52 is allowed to strike the reflective mask 40, and the light reflected by the mask is passed through the reduction optical system 54 and transferred to the semiconductor substrate with a resist 56.

The light striking the reflective mask 40 is absorbed by the absorber film at portions having the absorber film pattern 20a and is not reflected, and, on the other hand, the light striking portions having no absorber film pattern 20a is reflected by the multilayer reflective film 14. Thus, an image formed from the light reflected by the reflective mask 40 enters the reduction optical system 54. The exposure light which has passed through the reduction optical system 54 forms a transfer pattern on the resist layer on the semiconductor substrate with a resist 56. Then, the exposed resist layer is developed, so that a resist pattern can be formed on the semiconductor substrate with a resist 56.

Then, by performing, for example, etching using the above resist pattern as a mask, a predetermined interconnection pattern can be formed on, for example, a semiconductor substrate.

A semiconductor device is manufactured through the above steps and other required steps.

EXAMPLES

Hereinbelow, the present invention will be described in more detail with reference to the following Examples, which should not be construed as limiting the scope of the present invention.

Example 1

<Manufacture of a Substrate with a Multilayer Reflective Film>

The substrate to be used is a $SiO_2$—$TiO_2$ glass substrate (which is 6 inches square and has a thickness of 6.35 mm) The edge face of the glass substrate was subjected to beveling and grinding processing, and further subjected to rough polishing treatment using a polishing agent containing cerium oxide abrasive particles. The thus treated glass substrate was set in a carrier of a double-side polishing apparatus, and subjected to precision polishing under predetermined polishing conditions using an alkaline aqueous solution containing colloidal silica abrasive particles as a polishing agent. After completion of the precision polishing, the resultant glass substrate was subjected to cleaning treatment.

Thus, a glass substrate for a reflective mask blank for EUV lithography was prepared. With respect to the main surface of the obtained glass substrate, the surface roughness in terms of a root mean square (RMS) roughness was as excellent as 0.10 nm or less. Further, the flatness in a measurement region of 132 mm×132 mm was as excellent as 30 nm or less.

Then, on the back side of the glass substrate for a reflective mask blank for EUV lithography, a back side conductive film comprising CrN was formed by a magnetron sputtering method under the conditions shown below. Conditions for forming a back side conductive film: Cr target; Ar+$N_2$ gas atmosphere (Ar:$N_2$=90%:10%); film composition (Cr: 90 at %; N: 10 at %); film thickness: 20 nm Then, on the main surface of the glass substrate for reflective mask blank for EUV lithography opposite from the surface on which the back side conductive film is formed, a multilayer reflective film was formed as described below. As a multilayer reflective film formed on the glass substrate, for forming a multilayer reflective film suitable for an exposure light in a wavelength range of 13 to 14 nm, a Mo film/Si film periodic multilayer reflective film was employed.

That is, a multilayer reflective film was formed by alternately laminating a Mo layer and a Si layer on the substrate by ion beam sputtering (using Ar) using a Mo target and a Si target.

A Si film having a thickness of 4.2 nm was first formed, and then a Mo film having a thickness of 2.8 nm was formed. A series of the formations of these two films was taken as one cycle, and the films were similarly laminated in 40 cycles, and a Si film having a thickness of 4.0 nm was finally deposited to form a multilayer reflective film.

The resultant sample having the multilayer reflective film formed was subjected to annealing in air (at 200° C. for 10 minutes) to form a $SiO_2$ film on the surface of the multilayer reflective film (thickness: 1 nm).

Subsequently, using a RuTi target (Ru: 95.5 at %; Ti: 4.5 at %), a Ru protective film comprising RuTi (Ru: 95.5 at %; Ti: 4.5 at %) was formed on the $SiO_2$ film by DC magnetron sputtering in an Ar gas atmosphere (thickness: 2.5 nm).

The Ru protective film was deposited so that the RuTi sputtered particles struck the multilayer reflective film at an angle of incidence of 20 degrees to the normal of the surface of the multilayer reflective film. With respect to the formed Ru protective film, an X-ray diffractometry measurement was conducted by an In-Plane measurement method, and, as a result, only diffraction peaks appearing at (100), (110), and (200) were observed, and the Ru protective film was found to be formed from a Ru compound RuTi having an orientation plane mainly at (001) plane.

In the thus obtained substrate with a multilayer reflective film, the reflectance of the surface of the Ru protective film with respect to an EUV light having a wavelength of 13.5 nm was as high as 63.5%. Further, a flatness of the substrate with a multilayer reflective film was measured with respect to a region of 132 mm×132 mm in the middle of the substrate on the protective film side by a flatness measurement machine, and, as a result, the flatness was found to be as excellent as 330 nm. The reason for such a result is presumed that the annealing treatment for the multilayer reflective film at a relatively high temperature effectively reduced the stress of the multilayer reflective film.

<Manufacture of a Reflective Mask Blank for EUV Lithography>

On the Ru protective film of the above-obtained substrate with a multilayer reflective film was formed an absorber film comprising a laminated film of TaBN (thickness: 56 nm) and TaBO (thickness: 14 nm) by DC magnetron sputtering to manufacture a reflective mask blank for EUV lithography. The TaBN film was formed using a TaB target by reactive sputtering in a mixed gas atmosphere of Ar gas and $N_2$ gas, and the TaBO film was formed using a TaB target by reactive sputtering in a mixed gas atmosphere of Ar gas and $O_2$ gas.

Example 2

<Manufacture of a Substrate with a Multilayer Reflective Film>

A substrate with a multilayer reflective film was manufactured in substantially the same manner as in Example 1 except that the procedure of forming a $SiO_2$ film on the surface of the multilayer reflective film by annealing in air was not performed, and that a Ru protective film was formed by ion beam sputtering successively subsequent to the formation of the multilayer reflective film. The ion beam sputtering was performed using a RuTi target (Ru: 95.5 at %; Ti: 4.5 at %) so that the RuTi sputtered particles struck the multilayer reflective film at an angle of incidence of 30 degrees to the normal of the surface of the multilayer reflective film.

With respect to the formed Ru protective film, an X-ray diffractometry measurement was conducted by an In-Plane measurement method, and, as a result, only diffraction peaks appearing at (100), (110), and (200) were observed, and the Ru protective film was found to be formed from a Ru compound RuTi having an orientation plane mainly at (001) plane.

In the thus obtained substrate with a multilayer reflective film, the reflectance of the surface of the Ru protective film with respect to EUV light having a wavelength of 13.5 nm was as high as 64.2%.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC magnetron sputtering in the same manner as in Example 1 to manufacture a reflective mask blank for EUV lithography. The TaBN film and TaBO film were formed by reactive sputtering in the same manner as in Example 1.

Example 3

<Manufacture of a Substrate with a Multilayer Reflective Film>

A substrate with a multilayer reflective film was manufactured in substantially the same manner as in Example 2 except that the Ru and Ti ratios in the Ru protective film were changed to Ru: 75 at % and Ti: 25 at %. In the obtained substrate with a multilayer reflective film, the reflectance of the surface of the Ru protective film with respect to EUV light having a wavelength of 13.5 nm was as high as 63%.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC magnetron sputtering in the same manner as in Example 1 to manufacture a reflective mask blank for EUV lithography. The TaBN film and TaBO film were formed by reactive sputtering in the same manner as in Example 1.

Example 4

<Manufacture of a Substrate with a Multilayer Reflective Film>

The substrate with a multilayer reflective film obtained in Example 2 was subjected to annealing in air (at 180° C. for 10 minutes). In the resultant substrate with a multilayer reflective film, the reflectance of the surface of the Ru protective film with respect to EUV light having a wavelength of 13.5 nm was maintained at a reflectance as high as 64.0%.

Further, a flatness of the substrate with a multilayer reflective film was measured with respect to a region of 132 mm×132 mm in the middle of the substrate on the protective film side by a flatness measurement machine. As a result, it was found that the flatness before the annealing treatment was 850 nm, whereas the flatness after the annealing treatment was as excellent as 330 nm. The reason for such results is presumed that, like Example 1, the annealing treatment for the substrate with a multilayer reflective film at a relatively high temperature effectively reduced the stress of the multilayer reflective film.

With respect to the substrate with a multilayer reflective film obtained after the annealing treatment, the cross-section was examined by a TEM and a compositional analysis was made by energy dispersive X-ray spectroscopy (EDX). The results have confirmed that the upper layer portion, which is the surface of the Ru protective film, has a high film density, as compared to the lower layer portion. Further, the results have confirmed that, with respect to the composition of Ru and Ti in the depth direction of the film, the Ru content of the upper layer portion of the Ru protective film is greater than the Ru content of the lower layer portion. In addition, a tendency has been confirmed such that the Ru content of the Ru protective film in the direction toward the thickness is continuously increased toward the upper layer portion from the lower layer portion.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC magnetron sputtering in the same manner as in Example 1 to manufacture a reflective mask blank for EUV lithography. The TaBN film and TaBO film were formed by reactive sputtering in the same manner as in Example 1.

Comparative Example 1

<Manufacture of a Substrate with a Multilayer Reflective Film>

A substrate with a multilayer reflective film was manufactured in substantially the same manner as in Example 1 except that the protective film was changed to a protective film comprising Ru. In the obtained substrate with a multilayer reflective film, the reflectance of the surface of the Ru protective film with respect to EUV light having a wavelength of 13.5 nm was as high as 64%.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC magnetron sputtering in the same manner as in Example 1 to manufacture a reflective mask blank for EUV lithography. The TaBN film and TaBO film were formed by reactive sputtering in the same manner as in Example 1.

Comparative Example 2

<Manufacture of a Substrate with a Multilayer Reflective Film>

A substrate with a multilayer reflective film was manufactured in substantially the same manner as in Example 2 except that the protective film was changed to a protective film comprising RuZr. In the obtained substrate with a multilayer reflective film, the reflectance of the surface of the Ru protective film with respect to EUV light having a wavelength of 13.5 nm was as high as 64.5%.

Further, the obtained substrate with a multilayer reflective film was subjected to annealing in air (at 150° C. for 10 minutes) in the same manner as described above in Example 4 for the purpose of reducing the stress of the multilayer reflective film. As a result, the flatness of the substrate with a multilayer reflective film was improved to 375 nm, but the reflectance of the surface of the Ru protective film with respect to an EUV light having a wavelength of 13.5 nm was 62.0%, which is 2.5% lower than that before the annealing treatment. In addition, with respect to the substrate with a multilayer reflective film obtained after the annealing treatment, the cross-section was examined by means of a TEM. The results have confirmed that the surface of the Ru protective film is in a roughened state and oxygen seemed to be caused from oxidation of the surface of the Ru protective film has diffused into the inside of the Ru protective film.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC magnetron sputtering in the same manner as in Example 1 to manufacture a reflective mask blank for EUV lithography. The TaBN film and TaBO film were formed by reactive sputtering in the same manner as in Example 1.

[Mask Cleaning Resistance Test]

Using each of the reflective mask blanks for EUV lithography obtained in Examples 1 to 4 and Comparative Examples 1 and 2 above, a reflective mask for EUV lithography was manufactured. Specifically, the procedure is as follows.

First, a resist film for electron beam drawing was formed on the absorber film of the reflective mask blank, and drawing of a predetermined pattern was performed using an electron beam drawing machine. After the drawing, a predetermined development treatment was conducted to form a resist pattern on the absorber film.

Then, using the above-formed resist pattern as a mask, the TaBO film as the upper layer was subjected to dry etching by fluorine gas ($CF_4$ gas) and the TaBN film as the lower layer was subjected to dry etching by chlorine gas ($Cl_2$ gas) to form a transfer pattern in the absorber film, forming an absorber film pattern.

Further, the resist pattern remaining on the absorber film pattern was removed using hot sulfuric acid to obtain a reflective mask. Thus, from each of the reflective mask blanks in Examples 1 to 4 and Comparative Examples 1 and 2, 20 reflective masks were produced.

With respect to the obtained reflective mask, general RCA cleaning was performed repeatedly to evaluate the cleaning resistance of the reflective mask. The state of stripping of the protective film was examined by means of a SEM (scanning electron microscope). The results are shown in Table 1 below.

TABLE 1

| | Cleaning resistance |
|---|---|
| Example 1 | No stripping of film is observed after 100-time RCA cleaning |
| Example 2 | No stripping of film is observed after 100-time RCA cleaning |
| Example 3 | No stripping of film is observed after 100-time RCA cleaning |
| Example 4 | No stripping of film is observed after 100-time RCA cleaning |
| Comparative Example 1 | Stripping of film occurs after 5- to 10-time RCA cleaning |
| Comparative Example 2 | Stripping of film occurs after 5- to 10-time RCA cleaning |

As seen from Table 1, in each of the reflective masks in Examples 1 to 4, no stripping was observed in the Ru protective film exposed surface after the 100-time RCA cleaning, which indicates that these reflective masks have excellent cleaning resistance. On the other hand, in the reflective masks in Comparative Examples 1 and 2, the 5- to 10-time cleaning caused stripping of the film, which indicates that the cleaning resistance is poor, as compared to those in the Examples.

Further, in Examples 1 to 4, a difference of the reflectance for an EUV light (wavelength: 13.5 nm) at the Ru protective film exposed surface between the mask before the RCA cleaning and the mask after the 100-time RCA cleaning (the reflectance difference means a decrease in the reflectance for an EUV light due to the RCA cleaning, and this applies to the followings) was determined, and, as a result, the reflectance difference in Example 1 was 0.2%, that in Example 2 was 0.3%, that in Example 3 was 0.4%, and that in Example 4 was 0.2%, and thus all these reflectance differences were as excellent as 0.5% or less.

Example 5

<Manufacturing of a Reflective Mask Blank for EUV Lithography>

The same substrate with a multilayer reflective film as that in Example 4 above was prepared, and then an absorber film comprising a laminated film of TaN (thickness: 27.3 nm) and CrCON (thickness: 25 nm) and having a phase shift function was formed on the Ru protective film of the substrate with a multilayer reflective film by DC magnetron sputtering to manufacture a reflective mask blank for EUV lithography. The TaN film was formed using a Ta target by reactive sputtering in a mixed gas atmosphere of Ar gas and $N_2$ gas, and the CrCON film was formed using a Cr target by reactive sputtering in a mixed gas atmosphere of Ar gas, $CO_2$ gas, and $N_2$ gas.

<Manufacture of a Reflective Mask for EUV Lithography>

Using the above-obtained reflective mask blank for EUV lithography, a reflective mask for EUV lithography was manufactured. Specifically, the procedure is as follows.

First, a resist film for electron beam drawing was formed on the absorber film of the reflective mask blank, and a predetermined pattern was drawn using an electron beam drawing machine. After the drawing, a predetermined development treatment was conducted to form a resist pattern on the absorber film.

Then, using the above-formed resist pattern as a mask, the CrCON film as the upper layer was subjected to dry etching with mixed gas of chlorine gas ($Cl_2$ gas) and oxygen gas ($O_2$ gas) and the TaN film as the lower layer was subjected to dry etching with chlorine gas ($Cl_2$ gas) to form a transfer pattern in the absorber film, forming an absorber film pattern.

Further, the resist pattern remaining on the absorber film pattern was removed using hot sulfuric acid to obtain a reflective mask. The reflectance for EUV light of the absorber film pattern was 2.8%, and the phase difference by reflection between the absorber film pattern and the exposed protective film surface having no absorber film pattern formed was 180 degrees.

[Mask Cleaning Resistance Test]

With respect to the reflective mask obtained in Example 5 above, a mask cleaning resistance test was conducted in the same manner as in Examples 1 to 4 above. As a result, no stripping of the film was observed after the 100-time RCA cleaning, which indicates that the reflective mask has excellent cleaning resistance.

Further, in Example 5, the difference of the reflectance for an EUV light at the Ru protective film exposed surface between the mask before the RCA cleaning and the mask after the 100-time RCA cleaning was as excellent as 0.2%.

DESCRIPTION OF REFERENCE NUMERALS

10: Substrate with a multilayer reflective film
12: Substrate
14: Multilayer reflective film
16: Ru protective film
18: Film comprising a silicon oxide
20: Absorber film
20a: Absorber film pattern
22: Resist film
22a: Resist pattern
30: Reflective mask blank for EUV lithography
40: Reflective mask for EUV lithography
50: Pattern transfer apparatus
52: Laser plasma X-ray source
54: Reduction optical system
56: Semiconductor substrate with a resist

The invention claimed is:

1. A substrate with a multilayer reflective film, comprising:
   a substrate,
   a multilayer reflective film, formed on the substrate, having a layer comprising Si as a high refractive-index material and a layer comprising a low refractive-index material, wherein the layers are periodically laminated, and
   a Ru protective film, formed on the multilayer reflective film, for protecting the multilayer reflective film,
   wherein the surface layer on the other side of the multilayer reflective film opposite from the substrate is the layer comprising Si, and wherein the Ru protective film comprises a Ru compound comprising Ru and Ti, the Ru compound containing Ru in an amount greater than that in the stoichiometric composition of RuTi.

2. The substrate with a multilayer reflective film according to claim 1, wherein the Ru compound in the Ru protective film has diffraction peaks that appear mainly at (100) and (110), as measured by an In-Plane measurement method for X-ray diffractometry.

3. The substrate with a multilayer reflective film according to claim 1, wherein the Ru ratio in the Ru compound is more than 95 to less than 100 at %.

4. The substrate with a multilayer reflective film according to claim 1, wherein a Ru content of an upper layer portion of the Ru protective film is greater than a Ru content of a lower layer portion on the substrate side.

5. The substrate with a multilayer reflective film according to claim 1, the substrate with a multilayer reflective film further comprising a film comprising a silicon oxide provided between the multilayer reflective film and the Ru protective film.

6. The substrate with a multilayer reflective film according to claim 1, wherein the low refractive-index material is Mo.

7. A reflective mask blank for EUV lithography, the reflective mask blank comprising the substrate with a multilayer reflective film according to claim 1, and an absorber film, formed on the Ru protective film in the substrate with a multilayer reflective film, for absorbing an EUV light.

8. The reflective mask blank for EUV lithography according to claim 7 further comprising a resist film on the absorber film.

9. A method of manufacturing a reflective mask for EUV lithography, the method comprising patterning an absorber film in the reflective mask blank for EUV lithography according to claim 8 with the resist film to form an absorber film pattern on the Ru protective film.

10. A method of manufacturing a semiconductor device, the method comprising forming a transfer pattern on a semiconductor substrate using a reflective mask for EUV lithography obtained by the method of manufacturing a reflective mask for EUV lithography according to claim 9.

11. A reflective mask for EUV lithography, the reflective mask comprising the substrate with a multilayer reflective film according to claim 1, and an absorber film pattern, formed on the Ru protective film in the substrate with a multilayer reflective film, for absorbing an EUV light.

12. A method of manufacturing a semiconductor device, the method comprising forming a transfer pattern on a semiconductor substrate using the reflective mask for EUV lithography according to claim 11.

* * * * *